United States Patent
Ishino et al.

(10) Patent No.: US 10,622,397 B2
(45) Date of Patent: Apr. 14, 2020

(54) SEMICONDUCTOR APPARATUS AND EQUIPMENT

(71) Applicant: CANON KABUSHIKI KAISHA, Tokyo (JP)

(72) Inventors: Hideaki Ishino, Tokyo (JP); Takumi Ogino, Koganei (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/193,998

(22) Filed: Nov. 16, 2018

(65) Prior Publication Data
US 2019/0165027 A1    May 30, 2019

(30) Foreign Application Priority Data
Nov. 30, 2017    (JP) .................. 2017-230988

(51) Int. Cl.
*H01L 27/146* (2006.01)
*H01L 23/00* (2006.01)

(52) U.S. Cl.
CPC ........ *H01L 27/14634* (2013.01); *H01L 24/03* (2013.01); *H01L 24/05* (2013.01); *H01L 24/08* (2013.01); *H01L 27/14603* (2013.01); *H01L 27/14636* (2013.01); *H01L 27/14683* (2013.01); *H01L 24/48* (2013.01); *H01L 27/1464* (2013.01); *H01L 27/14612* (2013.01); *H01L 2224/0362* (2013.01); *H01L 2224/03614* (2013.01); *H01L 2224/03616* (2013.01); *H01L 2224/05086* (2013.01); *H01L 2224/05088* (2013.01); *H01L 2224/05093* (2013.01); *H01L 2224/05124* (2013.01); *H01L 2224/05624* (2013.01); *H01L 2224/05647* (2013.01); *H01L 2224/08145* (2013.01); *H01L 2224/48463* (2013.01); *H01L 2924/00014* (2013.01); *H01L 2924/10158* (2013.01); *H01L 2924/12043* (2013.01); *H01L 2924/1304* (2013.01)

(58) Field of Classification Search
None
See application file for complete search history.

(56) References Cited

U.S. PATENT DOCUMENTS

| | | | |
|---|---|---|---|
| 7,919,835 B2 * | 4/2011 | Akiyama | .............. H01L 21/768 257/621 |
| 8,138,594 B2 * | 3/2012 | Tanaka | .................... H01L 23/13 257/686 |
| 9,158,081 B2 * | 10/2015 | Jo | ............................. G02B 6/43 |
| 2011/0233702 A1 | 9/2011 | Takahashi | |
| 2016/0233264 A1 | 8/2016 | Kagawa | |

FOREIGN PATENT DOCUMENTS

| | | |
|---|---|---|
| JP | 2012-19096 A | 1/2012 |
| JP | 2012-033878 A | 2/2012 |
| JP | 2012-256736 A | 12/2012 |
| JP | 2016-34029 A | 3/2016 |

* cited by examiner

*Primary Examiner* — Chandra Chaudhari
(74) *Attorney, Agent, or Firm* — Canon U.S.A., Inc. IP Division

(57) ABSTRACT

A semiconductor layer includes an opening, and in a joint surface between structures, a portion between a semiconductor layer and an opening in a direction in which the semiconductor layers are stacked together includes a plurality of conductor portions and an insulator portion located between the plurality of conductor portions in a direction orthogonal to the direction.

20 Claims, 7 Drawing Sheets

SEMICONDUCTOR APPARATUS AND EQUIPMENT

BACKGROUND OF THE INVENTION

Field of the Invention

The aspect of the embodiments relates to a semiconductor apparatus in which a plurality of semiconductor layers are stacked together.

Description of the Related Art

A semiconductor apparatus is known in which a plurality of semiconductor layers are stacked together, and a plurality of structures between the plurality of semiconductor layers are bonded together. In Japanese Patent Application Laid-Open No. 2012-033878 and Japanese Patent Application Laid-Open No. 2012-256736, a conductor and an insulator are disposed on a joint surface.

Japanese Patent Application Laid-Open No. 2012-033878 discusses a technique in which an electrode portion including an electrode and a connection portion is disposed in a member in which a pixel portion where a plurality of photoelectric conversion elements are arranged is disposed. In the electrode portion, an opening is provided in a semiconductor substrate.

The publication of Japanese Patent Application Laid-Open No. 2012-256736 discusses a technique in which a wiring layer includes an interlayer insulating film, an electrode embedded in the interlayer insulating film, and a dummy electrode disposed around the electrode.

In a case where a semiconductor layer includes an opening, the joint strength of structures may decrease at a position overlapping the opening, and the reliability of a semiconductor apparatus may decrease.

SUMMARY OF THE INVENTION

According to an aspect of the embodiments, a semiconductor apparatus includes first and second semiconductor layers stacked to each other, a first structure disposed between the first and second semiconductor layers, and a second structure disposed between the first structure and the second semiconductor layer, the first and second structures being bonded to each other, wherein the second semiconductor layer includes an opening, and wherein in a joint surface between the first and second structures, a portion between the first semiconductor layer and the opening in a first direction in which the first and second semiconductor layers are stacked together includes first and second conductor portions and an insulator portion located between the first and second conductor portions in a second direction orthogonal to the first direction.

According to another aspect of the embodiments, a semiconductor apparatus includes first and second semiconductor layers stacked to each other, a first structure disposed between the first and second semiconductor layers, and a second structure disposed between the first structure and the second semiconductor layer, the first and second structures being bonded to each other, wherein the second semiconductor layer includes an opening, and wherein in one of the first and second structures, a portion between the first semiconductor layer and the opening in a first direction in which the first and second semiconductor layers are stacked together includes first and second conductor portions and an insulator portion located between the first and second conductor portions in a second direction orthogonal to the first direction, and the insulator portion is in contact with an insulator member included in the other of the first and second structures.

Further features of the disclosure will become apparent from the following description of exemplary embodiments with reference to the attached drawings.

DESCRIPTION OF THE EMBODIMENTS

Exemplary embodiments for carrying out the disclosure will be described below with reference to the drawings. In the following description and the drawings, components common to a plurality of drawings are designated by common signs. Accordingly, the common components are described with reference to the plurality of drawings, and the description of the components designated by the common signs is appropriately omitted.

Figure 1A:
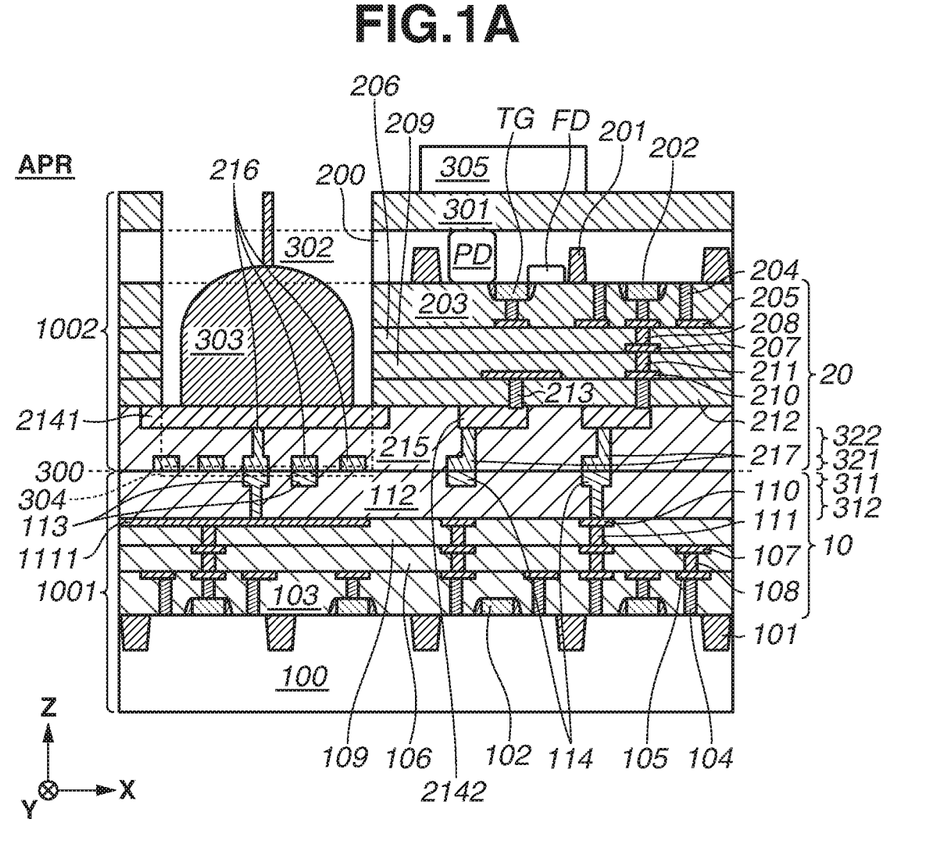
FIGS. 1A and 1B are diagrams illustrating a semiconductor apparatus.

FIG. 1A is a schematic cross-sectional view of a semiconductor apparatus APR according to an exemplary embodiment of the disclosure. The semiconductor apparatus APR includes semiconductor layers 100 and 200 stacked to each other. The semiconductor apparatus APR includes a wiring structure 10 disposed between the semiconductor layers 100 and 200, and a wiring structure 20 disposed between the wiring structure 10 and the semiconductor layer 200. In the semiconductor apparatus APR, the wiring structures 10 and 20 are bonded together. The wiring structures 10 and 20 are bonded together on a joint surface 300 including a joint region 311 of the wiring structure 10 and a joint region 321 of the wiring structure 20. The joint surface 300 may be paraphrased as a bonding surface, the joint region 311 and the joint region 321 may be paraphrased as a bonding region. The joint surface 300 includes the surface of the joint region 311 and the surface of the joint region 321. FIG. 1A illustrates a stacking direction Z in which the semiconductor layers 100 and 200 are stacked together, and orthogonal directions X and Y orthogonal to the stacking direction Z. The orthogonal directions X and Y are orthogonal to each other.

The wiring structure 10 includes an interlayer insulating film 103, a contact plug 104, a wiring layer 105, an interlayer insulating film 106, a wiring layer 107, a via plug 108, an interlayer insulating film 109, a wiring layer 110, and a via plug 111. The via plug 108 connects the wiring layers 105 and 107. The via plug 111 connects the wiring layers 107 and 110. Element isolation 101 having a shallow trench isolation (STI) structure defines an element region (an active region) of the semiconductor layer 100. The wiring structure 10 includes an insulator member 112 disposed on the wiring layer 110, and conductor portions 113 and 114. The conductor portions 113 and 114 have Damascene structures where the conductor portions 113 and 114 are embedded in recessed portions provided in the insulator member 112. At least parts of the conductor portions 113 and 114 are connected to the wiring layer 110 of the wiring structure 10. Particularly, the wiring layer 110 includes wiring 1111 and is connected to the conductor portions 113. The wiring 1111 provided in the wiring structure 10 is located between the semiconductor layer 100 and an opening 302 in the stacking direction Z. In this example, the conductor portions 113 and 114 have dual-Damascene structures. In the conductor portions 113 and 114, regions corresponding to the trenches of the dual-Damascene structures are included in the joint region 311 bonded to conductor portions 216 and 217. In the conductor portions 113 and 114, regions corresponding to the vias of the dual-Damascene structures are included in a connection region 312 connected to the wiring layer 110.

The wiring structure 20 includes an interlayer insulating film 203, a contact plug 204, a wiring layer 205, an interlayer insulating film 206, a wiring layer 207, a via plug 208, an interlayer insulating film 209, a wiring layer 210, and a via plug 211. The via plug 208 connects the wiring layers 205 and 207. The via plug 211 connects the wiring layers 207 and 210. The wiring structure 20 further includes electrodes 2141 and 2142, and a via plug 213 connecting the electrode 2142 and the wiring layer 210. Element isolation 201 having an STI structure defines an element region (an active region) of the semiconductor layer 200. The wiring structure 20 includes an insulator member 215 disposed on the electrodes 2141 and 2142, and conductor portions 216 and 217. The conductor portions 216 and 217 have Damascene structures where the conductor portions 216 and 217 are embedded in recessed portions provided in the insulator member 215. At least parts of the conductor portions 216 and 217 are connected to the electrodes 2141 and 2142 of the wiring structure 20. In this example, the conductor portions 216 and 217 have dual-Damascene structures. In the conductor portions 216 and 217, regions corresponding to the trenches of the dual-Damascene structures are included in the joint region 321 bonded to the conductor portions 113 and 114. In the conductor portions 216 and 217, regions corresponding to the vias of the dual-Damascene structures are included in a connection region 322 connected to the electrodes 2142 and 2141.

In one embodiment, the main components of the conductor portions 113, 114, 216, and 217 are made of copper. The present exemplary embodiment, however, is not limited to this. Alternatively, the main components of the conductor portions 113, 114, 216, and 217 may be gold or silver. Also, the main components of the insulator members 112 and 215 should be a silicon compound. The present exemplary embodiment, however, is not limited to this. Alternatively, the main component of the insulator member 215 may be a resin.

The semiconductor layer 200 includes the opening 302. The joint surface 300 and the joint regions 311 and 321 include a particular portion 304. The particular portion 304 is located between the semiconductor layer 100 and the opening 302 in the stacking direction Z in which the semiconductor layers 100 and 200 are stacked together. The particular portion 304 is a portion overlapping the opening 302 in the stacking direction Z and is a portion included in the orthogonal projection of the opening 302 on the joint surface 300 and the joint regions 311 and 321.

The particular portion 304 includes the plurality of conductor portions 113 and the insulator member 112. The plurality of conductor portions 113 and the insulator member 112 are included in the wiring structure 10. Thus, the plurality of conductor portions 113 and the insulator member 112 are located between the semiconductor layer 100 and the wiring structure 20 in the stacking direction Z. The plurality of conductor portions 113 are lined up in the orthogonal direction X. In the orthogonal direction X, the insulator member 112 is located between two of the plurality of conductor portions 113. In the insulator member 112, a portion located between the conductor portions 113 is referred to as an "insulator portion". Between the semiconductor layer 100 and the wiring structure 20 in the stacking direction Z, the particular portion 304 includes the plurality of conductor portions 113 and the insulator portion located between the plurality of conductor portions 113 in the orthogonal direction X.

The particular portion 304 includes the plurality of conductor portions 216 and the insulator member 215. The plurality of conductor portions 216 and the insulator member 215 are included in the wiring structure 20. The plurality of conductor portions 216 are lined up in the orthogonal direction X. In the orthogonal direction X, the insulator member 215 is located between two of the plurality of conductor portions 216. In the insulator member 215, a portion located between the conductor portions 216 is referred to as an "insulator portion". In the particular portion 304, at least one of the plurality of conductor portions 216 is bonded to at least one of the plurality of conductor portions 113.

On the joint surface 300, the insulator members 215 and 112 are bonded to each other. In the particular portion 304, the insulator portion in the joint region 311 and including the insulator member 112 is in contact with the insulator member 215 in the joint region 321. Further, in the particular portion 304, the insulator portion in the joint region 321 and including the insulator member 215 is in contact with the insulator member 112 in the joint region 311. As described above, in the particular portion 304, the insulator portion in the joint region 311 or 321 of one of the wiring structures 10 and 20 is in contact with the insulator member 112 or 215 included in the other of the wiring structures 10 and 20. In the particular portion 304, the insulator portion in the insulator member 112 and located between the plurality of conductor portions 113 is bonded to the insulator portion in the insulator member 215 and located between the plurality of conductor portions 216. "bonding" means that an adhesive force due to an intermolecular force occurs between two members, and also includes a case where the two members are separate from each other by an adhesive layer. On the other hand, "contact" means that two members are not separate from each other, and also includes a case where an adhesive force due to an intermolecular force does not occur between the two members.

A non-particular portion, which is a portion other than the particular portion 304 in the joint surface 300, includes the plurality of conductor portions 114 and the insulator member 112. The plurality of conductor portions 114 and the insulator member 112 are included in the wiring structure 10. The plurality of conductor portions 114 are lined up in the orthogonal direction X. In the orthogonal direction X, the insulator member 112 is located between two of the plurality of conductor portions 114. In the insulator member 112, a portion located between the conductor portions 114 is referred to as an "insulator portion".

The non-particular portion, which is a portion other than the particular portion 304 in the joint surface 300, includes the plurality of conductor portions 217 and the insulator member 215. The plurality of conductor portions 217 and the insulator member 215 are included in the wiring structure 20. The plurality of conductor portions 217 are lined up in the orthogonal direction X. In the orthogonal direction X, the insulator member 215 is located between two of the plurality of conductor portions 217. In the insulator member 215, a portion located between the conductor portions 217 is referred to as an "insulator portion".

In the particular portion 304 overlapping the opening 302, the insulator portions, which are parts of the insulator members 215 and 112, are located between the plurality of conductor portions 216 and 113, whereby it is possible to enhance the joint strength of the particular portion 304.

In the wiring structure 20, the electrode 2141 is provided between the particular portion 304 and the opening 302 in the stacking direction Z. In the particular portion 304, as described above, the insulator portion is located between the plurality of conductor portions 216. Thus, the electrode 2141 is located between the plurality of conductor portions 216 and the opening 302 in the stacking direction Z. Further, the electrode 2141 is located between the insulator portion between the plurality of conductor portions 216 and the opening 302 in the stacking direction Z.

In this example, the electrode 2141 includes a portion located between the semiconductor layers 100 and 200 in the stacking direction Z. That is, the electrode 2141 in this example includes a portion that is not located between the opening 302 and the semiconductor layer 100 in the stacking direction Z. This is because a width W1$x$ of the electrode 2141 in the orthogonal direction X is greater than a width W2$x$ of the opening 302 in the orthogonal direction X. Although not illustrated in FIG. 1A, a width W1$y$ of the electrode 2141 in the orthogonal direction Y is also greater than a width W2$y$ of the opening 302 in the orthogonal direction Y.

In one embodiment, the main component of the electrode 2141 is made of aluminum. The present exemplary embodiment, however, is not limited to this. Alternatively, the main component of the electrode 2141 may be copper.

In the opening 302, a conductive member 303 is provided. The conductive member 303 is electrically connected to the electrode 2141. The conductive member 303 in this example is a bonding wire formed by a wire bonding method. The conductive member 303 is not limited to a bonding wire. The conductive member 303 may be a through via formed by a deposition method or a plating method, or may be a bump formed by a printing method or a plating method. The main component of the conductive member 303 can be appropriately selected from a metal, a metal alloy, and a metal compound according to the form of the conductive member 303.

In the particular portion 304, the insulator portions are placed between the conductor portions 113 and 216, whereby, even if a mechanical stress is applied to the joint surface 300 by providing the conductive member 303, it is possible to suppress a decrease in the joint strength on the joint surface 300. As a result, it is possible to improve the reliability of the semiconductor apparatus ARP.

In the present exemplary embodiment, the semiconductor layer 100 is thicker than the semiconductor layer 200. The thickness of the semiconductor layer 100 is, for example, 10 to 1000 μm, or 100 to 800 μm. The thickness of the semiconductor layer 200 is, for example, 1 to 100 μm, or 1 to 10 μm. The semiconductor layer 100 is made thick, whereby it is possible to support the particular portion 304 by the semiconductor layer 100 and enhance the bonding strength of the particular portion 304.

Figure 1B:
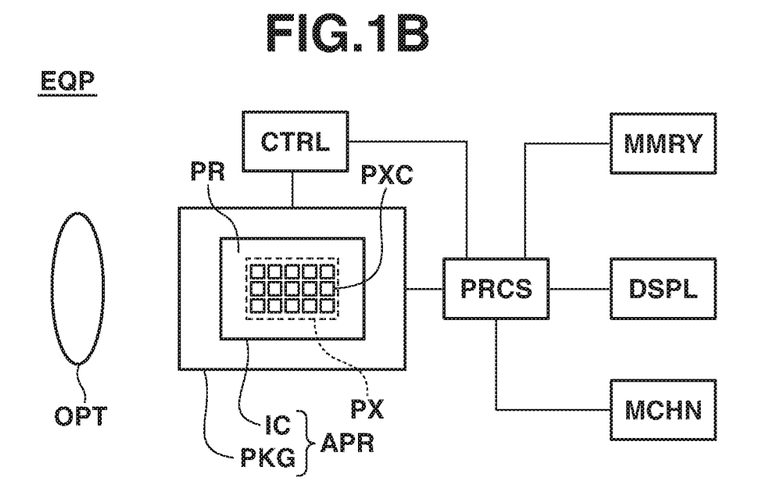

FIG. 1B is a schematic diagram illustrating the semiconductor apparatus APR. The semiconductor apparatus APR includes a semiconductor device IC including the semiconductor layers 100 and 200, and a package PKG on which the semiconductor device IC is mounted. The semiconductor apparatus APR in this example is a photoelectric conversion apparatus. The semiconductor device IC includes a pixel region PX in which a pixel circuit PXC is arranged in a matrix, and a peripheral region PR in the periphery of the pixel region PX. In the peripheral region PR, a peripheral circuit can be provided. FIG. 1B illustrates an equipment EQP including the semiconductor apparatus APR. The equipment EQP can further include at least any of an optical system OPT, a control apparatus CTRL, a processing apparatus PRCS, a display apparatus DSPL, a storage apparatus MMRY, and a machine apparatus MCHN. The details of the equipment EQP will be described below.

As illustrated in FIG. 1A, in the semiconductor layer 200, a photodiode PD and floating diffusion FD are provided. A transfer gate TG provided in the semiconductor layer 200 transfers the charge of the photodiode PD to the floating diffusion FD. Additionally, in the semiconductor layer 200, the pixel circuit PXC for converting a charge generated in the photodiode PD into a pixel signal is provided. The pixel circuit PXC can include a pixel transistor 202 such as a reset transistor, an amplification transistor, or a selection transistor.

In the semiconductor apparatus APR as the photoelectric conversion apparatus, an optical member 305 including a microlens and a color filter is placed on the semiconductor layer 200.

In the semiconductor layer 100, a plurality of transistors 102 are provided. The plurality of transistors 102 of the semiconductor layer 100 can form a complementary metal-oxide-semiconductor (CMOS) circuit. In the semiconductor apparatus APR as the photoelectric conversion apparatus, an integrated circuit of the semiconductor layer 100 can include a signal processing circuit such as an analog-to digital (AD) conversion circuit or a noise removal circuit for processing a pixel signal. The source and the drain of each transistor 102 of the semiconductor layer 100 can include a silicide layer made of cobalt silicide or nickel silicide. The gate electrode of the transistor 102 of the semiconductor layer 100 can include a silicide layer, a metal layer, or a metal compound layer. The gate insulating film of the transistor 102 of the semiconductor layer 100 can be a silicon nitride film or a metallic oxide film.

FIGS. 2A to 2E illustrate examples of the conductor portions 216 and 113. The conductor portions 216 are of four types. Conductor portions 2161 of a first type are bonded to the conductor portions 113 and are connected to the electrode 2141. Conductor portions 2162 of a second type are bonded to the conductor portions 113 and are not connected to the electrode 2141. Conductor portions 2163 of a third type are not bonded to the conductor portions 113 and are connected to the electrode 2141. Conductor portions 2164 of a fourth type are not bonded to the conductor portions 113 and are not connected to the electrode 2141. The conductor portions 2163 of the third type and the conductor portions 2164 of the fourth type, which are not bonded to the conductor portions 113, are in contact with the insulator member 112. That is, the electrode 2141 is connected to one (the conductor portions 2161 or 2163) of two types of conductor portions and is not connected to the other (the conductor portions 2162 or 2164) of the two types of conductor portions. In this example, the conductor portions 2161 and 2162, which are bonded to the conductor portions 113, are partially in contact with the insulator member 112 on the joint surface 300.

The conductor portions 113 are also of four types. Conductor portions 1131 of a first type are bonded to the conductor portions 216 and are connected to the wiring 1111. Conductor portions 1132 of a second type are bonded to the conductor portions 216 and are not connected to the wiring 1111. Conductor portions 1133 of a third type are not bonded to the conductor portions 216 and are connected to the wiring 1111. Conductor portions 1134 of a fourth type are not bonded to the conductor portions 216 and are not connected to the wiring 1111. The conductor portions 1133 of the third type and the conductor portions 1134 of the fourth type, which are not bonded to the conductor portions 216, are in contact with the insulator member 215. In this example, the conductor portions 1131 and 1132, which are bonded to the conductor portions 216, are partially in contact with the insulator member 215 on the joint surface 300.

There are 12 types of combinations of the conductor portions 2161, 2162, 2163, and 2164 of the four types of the conductor portions 216 and the conductor portions 1131, 1132, 1133, and 1134 of the four types of the conductor portions 113. In one embodiment, two or more types of conductor portions are present in the particular portion 304. In another embodiment, four or more types of conductor portions are present in the particular portion 304.

Figure 2A:
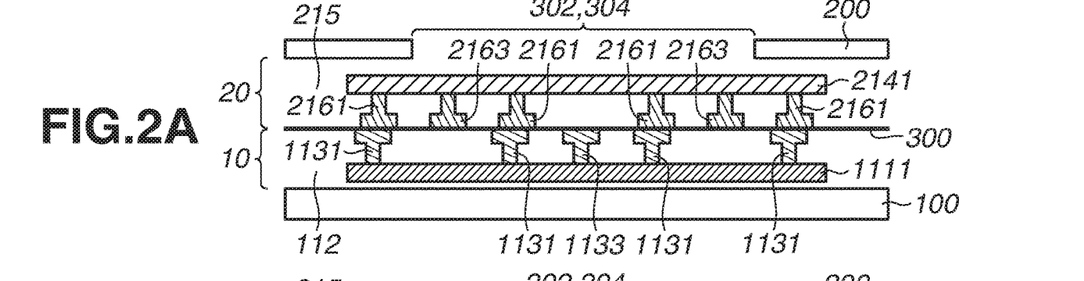
FIGS. 2A to 2E are diagrams illustrating the semiconductor apparatus.

In the example of FIG. 2A, the conductor portions 2161 and 2163 of the first and third types and the conductor portions 1131 and 1133 of the first and third types are provided. The conductor portions 2161 of the first type and the conductor portion 2163 of the third type are alternately provided, and the conductor portions 1131 of the first type and the conductor portions 1133 of the third type are alternately provided.

Figure 2B:
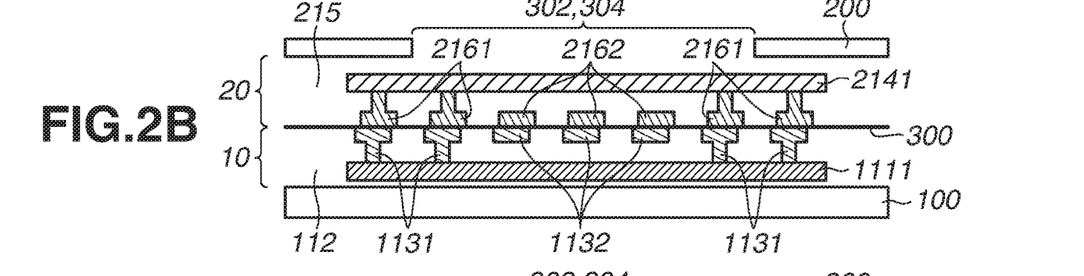
Figure 2C:
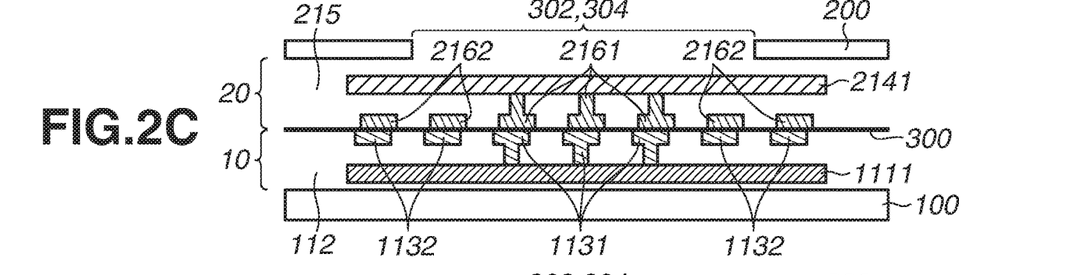
Figure 2D:
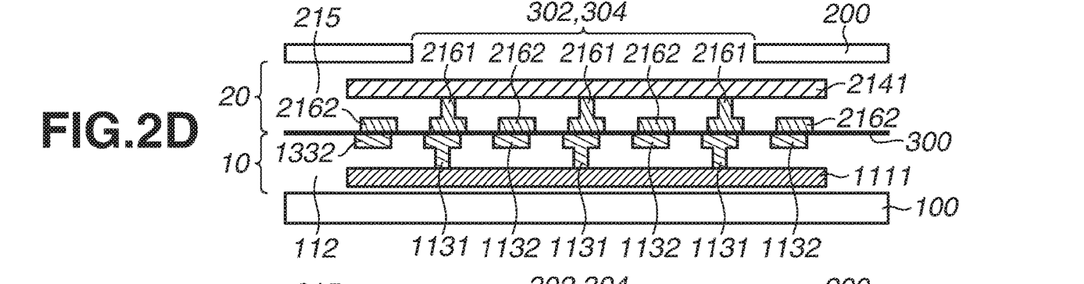

In the examples of FIGS. 2B to 2D, the conductor portions 2161 and 2162 of the first and second types and the conductor portions 1131 and 1132 of the first and second types are provided. In the example of FIG. 2B, a plurality of conductor portions 2162 and 1132 of the second types are provided between a plurality of conductor portions 2161 and 1131 of the first types. In the example of FIG. 2C, a plurality of conductor portions 2161 and 1131 of the first types are provided between a plurality of conductor portions 2162 and 1132 of the second types. In the example of FIG. 2D, a pair of conductor portions 2162 and 1132 of the second types and a pair of conductor portions 2161 and 1131 of the first types are alternately provided.

Figure 2E:
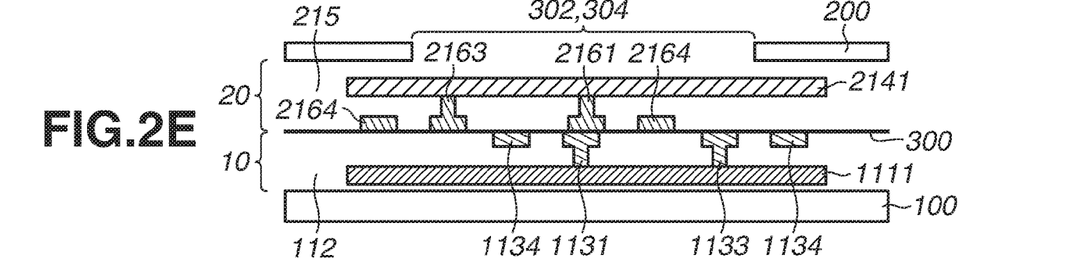

In the example of FIG. 2E, the conductor portions 2161, 2163, and 2164 of the first, third, and fourth types and the conductor portions 1131, 1133, and 1134 of the first, third, and fourth types are provided. The conductor portions 2161 of the first type and the conductor portions 2164 of the fourth type are alternately provided, and the conductor portions 1131 of the first type and the conductor portions 1134 of the fourth type are alternately provided.

As illustrated in FIGS. 2B to 2D, in the particular portion 304, the conductor portions 2162, 2164, 1132, and 1134, which are not connected to the electrode 2141 or the wiring 1111, are placed. This can prevent the density of vias in the connection regions 312 and 322 in the particular portion 304 from being extremely different from the density of vias in the connection regions 312 and 322 in the non-particular portion. This can improve the flatness of the joint surface 300 and enhance the joint strength on the joint surface 300.

FIGS. 3A to 3D illustrate plan views of examples of the arrangement relationships between the conductor portions 216 and 113, and the opening 302 and the electrode 2141. FIGS. 3A to 3D mean that at least either of the conductor portions 216 and 113 has forms illustrated in FIGS. 3A to 3D. Both the conductor portions 216 and 113 may have the same pattern, or the conductor portions 216 and 113 may have different patterns.

Figure 3A:
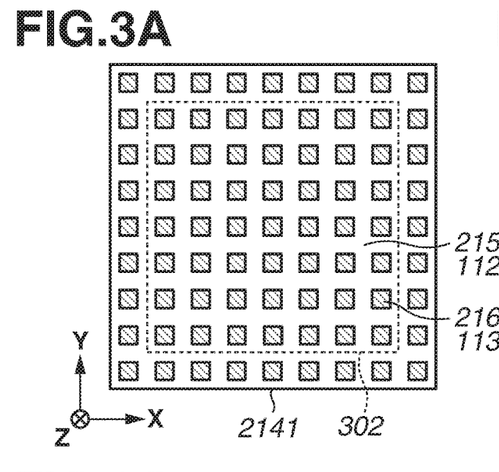
FIGS. 3A to 3F are diagrams illustrating the semiconductor apparatus.

In a first example illustrated in FIG. 3A, the conductor portions 216 and 113 are arranged in a matrix relative to the electrode 2141. Then, the insulator portions 215 and 112, which are sandwiched between the conductor portions 216 and 113, are arranged in a grid extending in both the X-direction and the Y-direction. The conductor portions 216 and 113 may be shifted from each other. The conductor portions 216 and 113 and the insulator portions 215 and 112 are thus regularly formed, whereby it is possible to efficiently relieve stress on the joint surface 300. As a variation of the first example, the insulator portions 215 and 112 may be arranged in a matrix, and the conductor portions 216 and 113 may be arranged in a grid in the X-direction and the Y-direction.

Figure 3B:
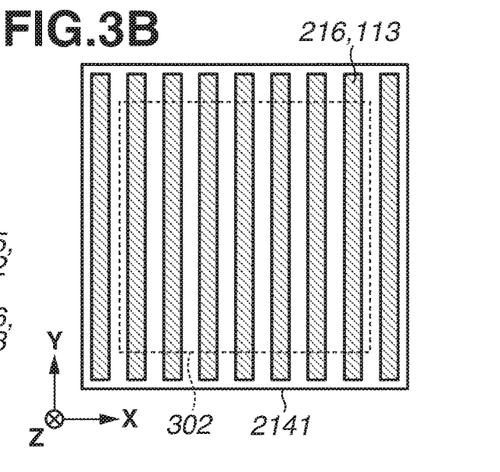

In a second example illustrated in FIG. 3B, the conductor portions 216 and 113 are arranged in stripes extending in only one of the X-direction and the Y-direction relative to the electrode 2141. Then, the insulator portions 215 and 112, which are sandwiched between the conductor portions 216 and 113, are arranged in a grid extending in only one of the X-direction and the Y-direction. The conductor portions 216 and 113 may be shifted from each other. The conductor portions 216 and 113 and the insulator portions 215 and 112 are thus regularly formed, whereby it is possible to efficiently relieve stress on the joint surface 300.

Figure 3C:
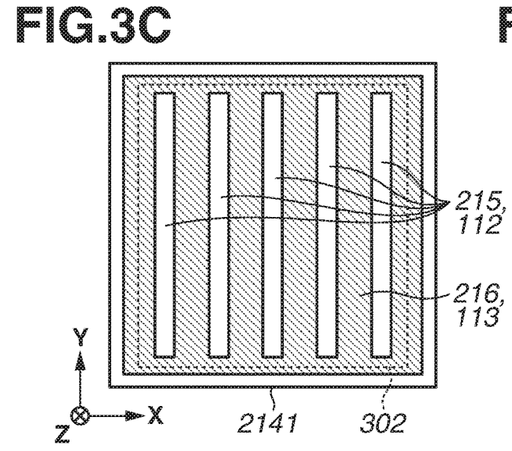

In a third example illustrated in FIG. 3C, the conductor portions 216 and 113 are arranged in a grid extending in only one of the X-direction and the Y-direction relative to the electrode 2141. Then, the insulator portions 215 and 112, which are sandwiched between the conductor portions 216 and 113, are arranged in stripes extending in only one of the X-direction and the Y-direction. The conductor portions 216 and 113 may be shifted from each other. The conductor portions 216 and 113 and the insulator portions 215 and 112 are thus regularly formed, whereby it is possible to efficiently relieve stress on the joint surface 300.

Figure 3D:
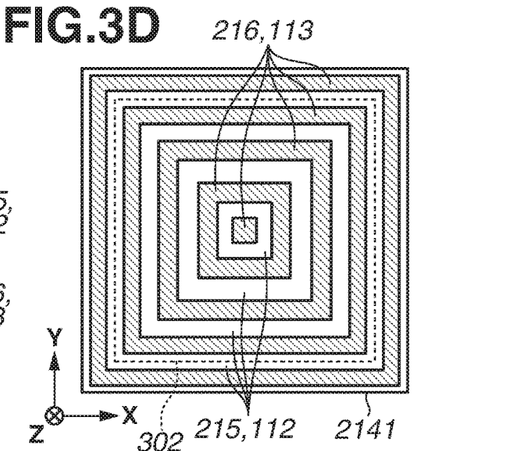

In a fourth example illustrated in FIG. 3D, the conductor portions 216 and 113 and the insulator portions 215 and 112 are arranged to alternately surround each other relative to the electrode 2141. The conductor portions 216 and 113 may be shifted from each other. The conductor portions 216 and 113 and the insulator portions 215 and 112 are thus regularly formed, whereby it is possible to efficiently relieve stress on the joint surface 300.

Figure 3E:
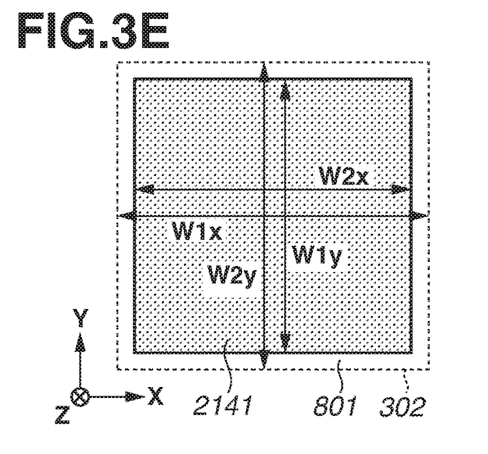
Figure 3F:
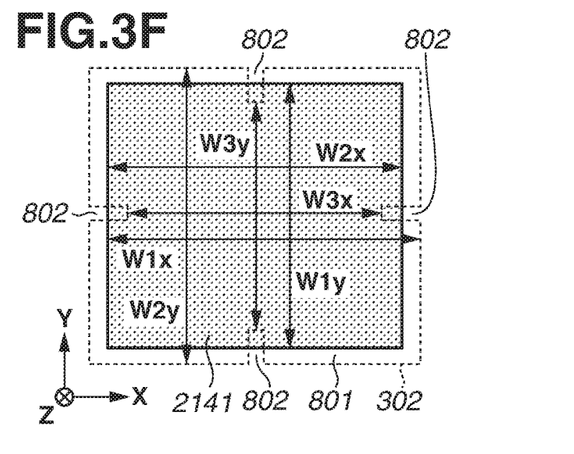
Figure 4A:
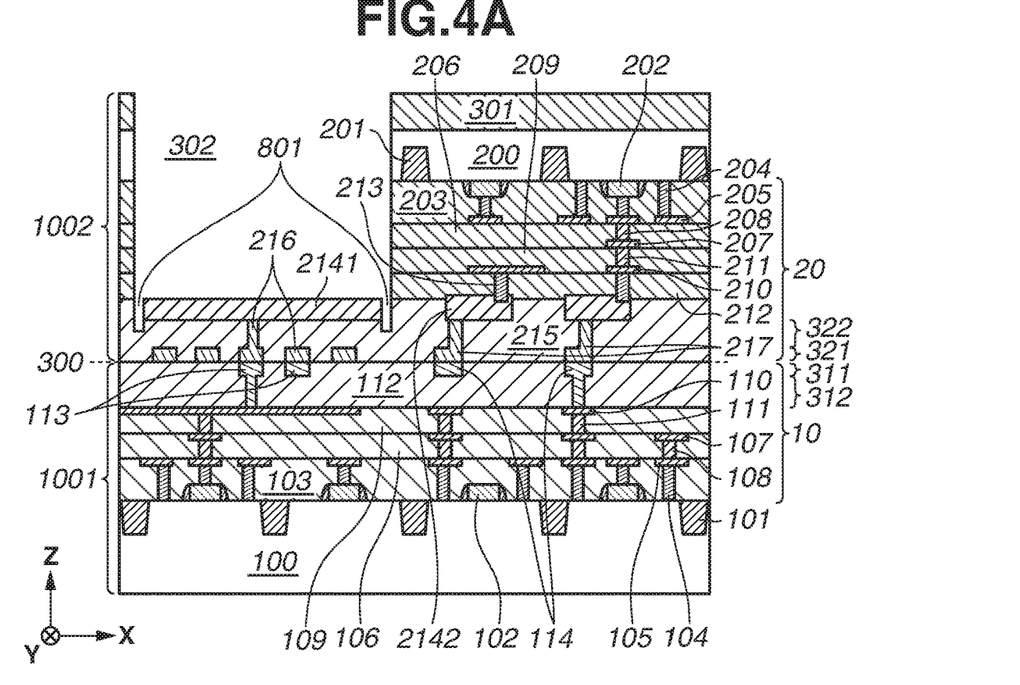
FIGS. 4A and 4B are diagrams illustrating the semiconductor apparatus.
Figure 4B:
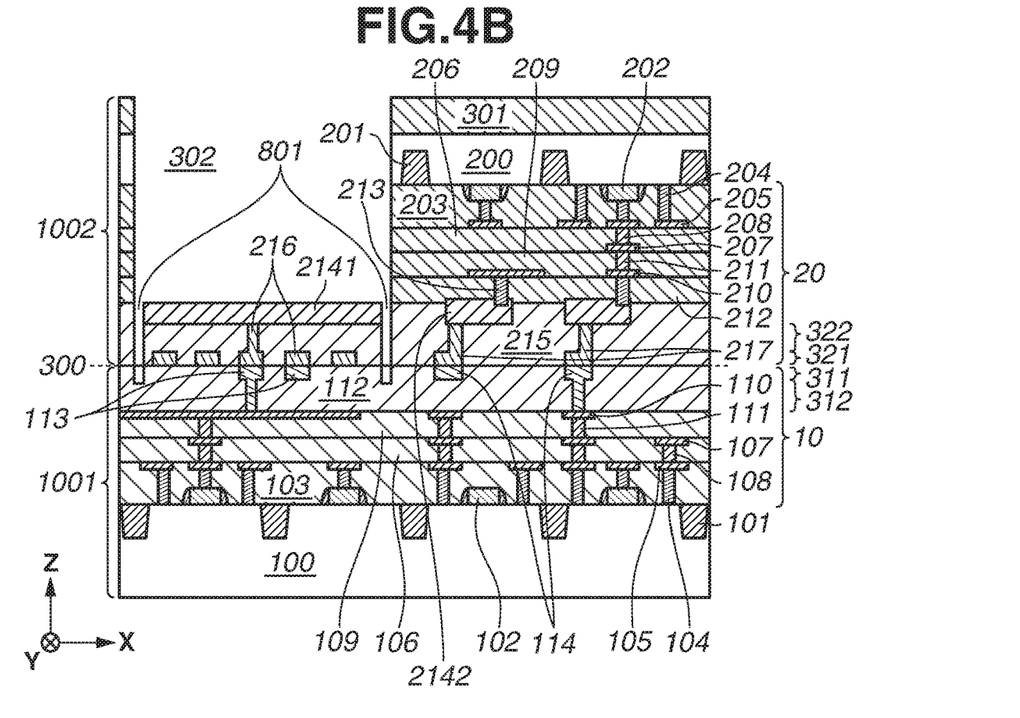

FIGS. 4A and 4B are cross-sectional views of the semiconductor apparatus APR, illustrating other forms of the semiconductor apparatus APR in FIG. 1A. FIGS. 3E and 3F are plan views of the semiconductor apparatus APR in FIG. 1A, corresponding to parts of FIGS. 4A and 4B.

In FIGS. 4A and 4B, the width $W1x$ of the electrode 2141 in the orthogonal direction X is smaller than the width $W2x$ of the opening 302 in the orthogonal direction X ($W1x < W2x$). As illustrated in FIGS. 3E and 3F, the width $W1y$ of the electrode 2141 in the orthogonal direction Y is also smaller than the width $W2y$ of the opening 302 in the orthogonal direction Y ($W1y < W2y$).

The wiring structure 20 includes the electrode 2142 disposed side by side with the electrode 2141 in the orthogonal directions X and Y, and the insulator member 215 disposed between the electrodes 2141 and 2142 in the orthogonal directions X and Y. Then, a trench 801 is provided between the electrode 2141 and the insulator member 215. The trench 801 may be paraphrased as a groove or a ditch. One side face of the trench 801 may be formed by the electrode 2141. Another side of the trench 801 may be formed by the insulator member 215, said another side of the trench 801 being opposite to the one side of the trench 801. The trench 801 may be configured so that a gas such as air is present in the trench 801. The insulator member 215 is placed side by side with the electrode 2141 in the orthogonal directions X and Y. The trench 801 can communicate with the opening 302. In the form of FIG. 4A, the trench 801 is provided in the wiring structure 20 and is not provided in the wiring structure 10. The electrode 2141 is separated from the insulator member 215 by the trench 801. This relieves stress on the joint surface 300 more efficiently.

In the form of FIG. 4B, the trench 801 is provided in the wiring structure 20 and reaches the wiring structure 10. Thus, the trench 801 is also provided in the wiring structure 10. In this case, the particular portion 304 is separated from the non-particular portion by the trench 801 in the joint surface 300. This relieves stress on the joint surface 300 more efficiently.

In the form illustrated in FIG. 3F, protruding portions 802 are formed in parts of the inner walls of the opening 302 by the semiconductor layer 200. A width W3$x$ of a portion corresponding to the protruding portions 802 of the inner walls of the opening 302 in the orthogonal direction X is smaller than the width W1$x$ of the electrode 2141 in the orthogonal direction X. Further, a width W3$y$ of a portion corresponding to the protruding portions 802 of the inner walls of the opening 302 in the orthogonal direction Y is smaller than the width W1$y$ of the electrode 2141 in the orthogonal direction Y. Thus, the particular portion 304 is separated from the non-particular portion by the trench 801 while the particular portion 304 is partially continuous with the non-particular portion. This can improve the strength of the joint surface 300 as compared to the form of FIG. 3E.

Figure 5A:
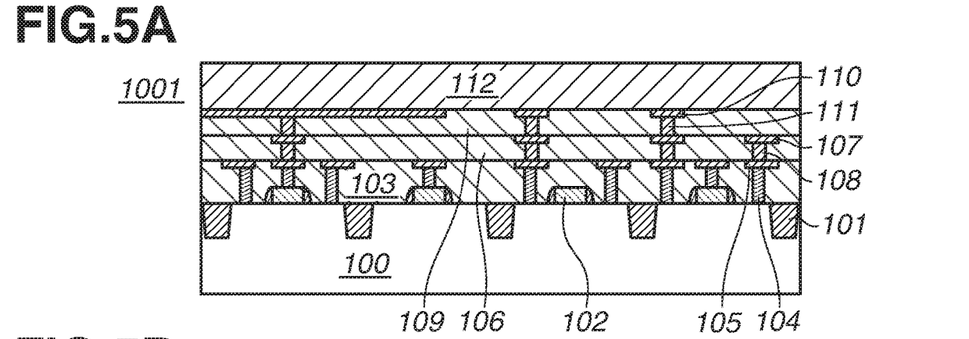
FIGS. 5A to 5D are diagrams illustrating a method for manufacturing the semiconductor apparatus.

With reference to FIGS. 5A to 7*j*, a method for manufacturing the semiconductor apparatus APR will be described. A first part 1001 illustrated in FIG. 5A is prepared. The first part 1001 includes a semiconductor layer 100, element isolation 101, a gate electrode of transistor 102, a first interlayer insulating film 103, and a contact plug 104. The first part 1001 further includes a first wiring layer 105, a second interlayer insulating film 106, a second wiring layer 107, and a via plug 108 connecting the first wiring layer 105 and the second wiring layer 107. The first part 1001 further includes a third interlayer insulating film 109, a third wiring layer 110, and a via plug 111 connecting the second wiring layer 107 and the third wiring layer 110. Further, the number of wiring layers can be optionally selected. Further, in this illustrated example, only a metal-oxide-semiconductor (MOS) transistor is placed on the surface of the semiconductor layer 100. The present exemplary embodiment, however, is not limited to this. For example, a MOS capacitor, a trench capacitor, a resistor using a part of the semiconductor layer 100, or a resistor using the gate electrode 102 can also be placed. Further, a metal-insulator-metal (MIM) capacitor can also be placed between wiring layers.

Next, as illustrated in FIG. 5A, an insulator member 112 is formed. The insulator member 112 is, for example, a silicon dioxide film, a silicon nitride film, a silicon oxynitride film, a carbon-containing silicon dioxide film, or a fluorine-containing silicon dioxide film. Further, the layer structure of the film may be a monolayer structure including a single type of material, or may be a multilayer structure including a plurality of materials.

Figure 5B:
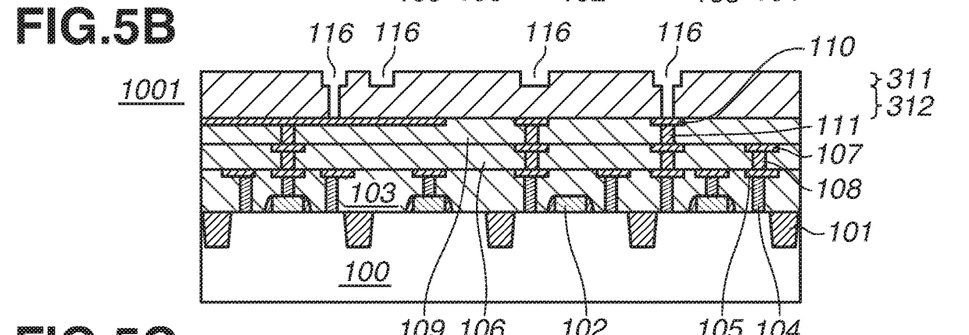

Next, as illustrated in FIG. 5B, a plurality of recessed portions 116 for embedding conductor portions are formed in the insulator member 112. At least parts of the plurality of recessed portions 116 are formed to include via holes reaching the wiring layer 110. The plurality of recessed portions 116 are placed in a particular portion 304 to be obtained after substrates are bonded together, and are also placed in a portion other than the particular portion 304. At this time, the recessed portions 116 are placed at an appropriate density in each of the particular portion 304 and the region other than the particular portion 304. The recessed portions 116 include trenches and via holes disposed at the bottoms of the trenches. The trenches are formed in a joint region 311, and the via holes are formed in a connection region 312.

Figure 5C:
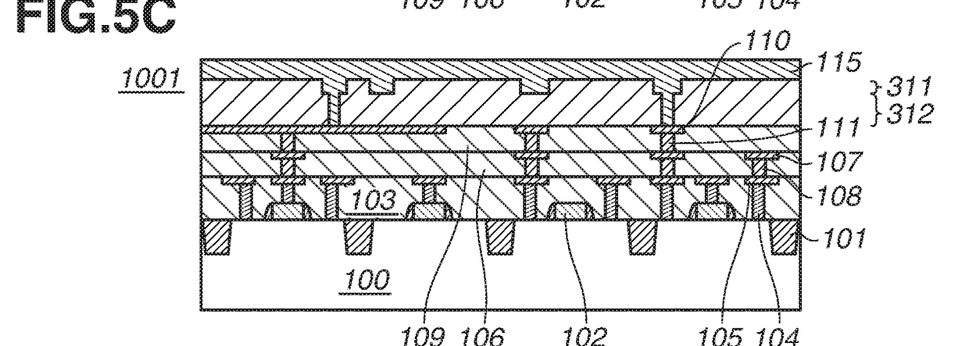

Next, as illustrated in FIG. 5C, a conductor material 115 is formed over the entirety of the surface of the substrate. At this time, the recessed portions 116 are filled with the conductor material 115. The material of the conductor material 115 can be copper.

Figure 5D:
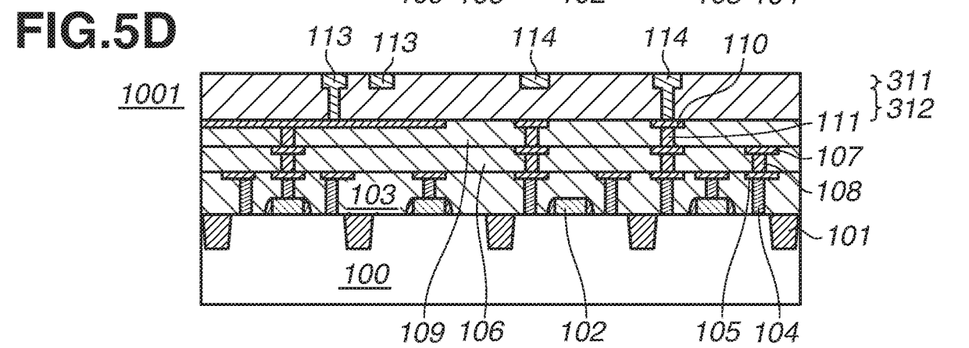

Next, as illustrated in FIG. 5D, an extra portion of the conductor material 115 is removed by a chemical mechanical polishing (CMP) method, thereby forming conductor portions 113 and 114. By the above processes, the first part 1001 before being bonded is completed. When this CMP is performed, a plurality of conductor portions 113 are formed at an appropriate density in each of the particular portion 304 and the region other than the particular portion 304. Thus, dishing and erosion by the CMP are suppressed. This improves the flatness of the surface of the substrate of the first part 1001 before being bonded.

Figure 6A:
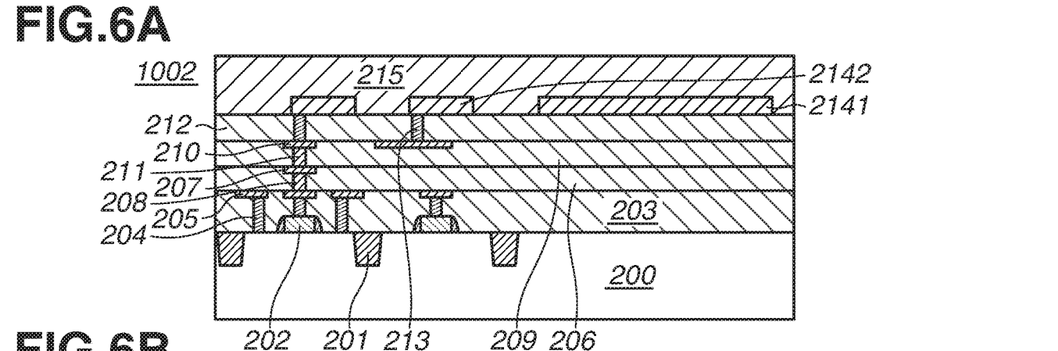
FIGS. 6A to 6D are diagrams illustrating the method for manufacturing the semiconductor apparatus.

Further, a second part 1002 illustrated in FIG. 6A is prepared. The second part 1002 includes a semiconductor layer 200, element isolation 201, a gate electrode 202, a first interlayer insulating film 203, and a contact plug 204. The second part 1002 further includes a first wiring layer 205, a second interlayer insulating film 206, a second wiring layer 207, and a via plug 208 connecting the first wiring layer 205 and the second wiring layer 207. The second part 1002 further includes a third interlayer insulating film 209, a third wiring layer 210, and a via plug 211 connecting the second wiring layer 207 and the third wiring layer 210. Further, the number of wiring layers can be optionally selected. Further, in this illustrated example, only a MOS transistor is placed on the surface of the semiconductor layer 200. The present exemplary embodiment, however, is not limited to this. For example, a MOS capacitor, a trench capacitor, or a resistor using a part of the semiconductor layer 200, or a resistor using the gate electrode 202 can also be placed. Further, an MIM capacitor can also be placed between wiring layers.

Next, an insulating film 212 is formed. The insulating film 212 is, for example, a silicon dioxide film, a silicon nitride film, a silicon oxynitride film, a carbon-containing silicon dioxide film, or a fluorine-containing silicon dioxide film. Further, the layer structure of the film may be a monolayer structure including a single type of material, or may be a multilayer structure including a plurality of materials.

Next, trenches are formed on the surface of the insulating film 212 by etching, and a conductor is formed over the entire surface of the substrate by physical vapor deposition (PVD) or chemical vapor deposition (CVD), thereby filling the trenches with the conductor. The conductor on the surface of the substrate is removed by CMP or etch back, thereby forming a via plug 213 in the insulating film 212 as illustrated in FIG. 6A. Next, a conductor film is formed. The material of the conductor film can be aluminum.

Next, the conductor film is patterned. The patterning is performed by photolithography and etching. As a result, a part of the conductor film is patterned into an electrode 2141, and a part of the conductor film is patterned into an electrode 2142.

Next, an insulating film as the insulator member 215 is formed. The insulating film as the insulator member 215 is, for example, a silicon dioxide film, a silicon nitride film, a silicon oxynitride film, a carbon-containing silicon dioxide film, or a fluorine-containing silicon dioxide film. Further, the layer structure of the film may be a monolayer structure including a single type of material, or may be a multilayer structure including a plurality of materials. For example, a silicon dioxide film is formed and then planarized by CMP, and a silicon nitride film is formed on the planarized silicon dioxide film, whereby it is possible to form the insulating film as the insulator member 215 including two types of films and having a planarized surface.

Figure 6B:
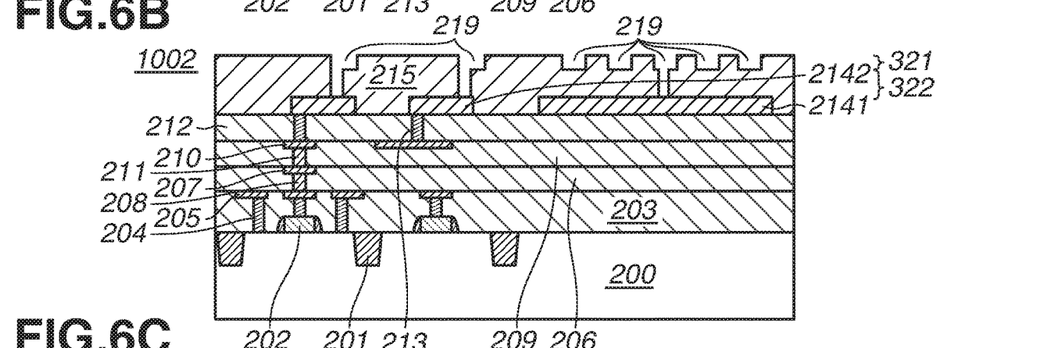

Next, as illustrated in FIG. 6B, a plurality of recessed portions 219 for embedding conductor portions in the insulating film 215 are formed. The recessed portions 219 include trenches and via holes disposed at the bottoms of the trenches. At least parts of the plurality of recessed portions 219 are formed to include via holes reaching the electrodes 2142 and 2141. The trenches are formed in a joint region 321, and the via holes are formed in a connection region 322. The plurality of recessed portions 219 are placed in the particular portion 304 to be obtained after the substrates are bonded together, and are also placed in the portion other than the particular portion 304. At this time, the recessed portions 219 are placed at an appropriate density in each of the particular portion 304 and the region other than the particular portion 304.

Figure 6C:
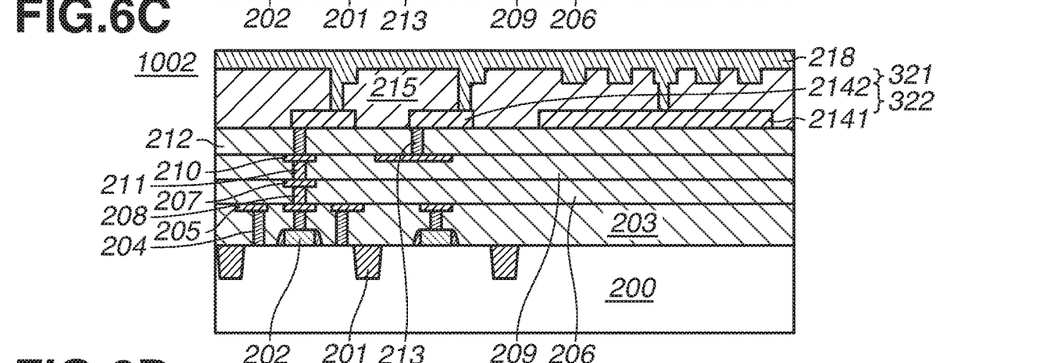

Next, as illustrated in FIG. 6C, a conductor material 218 is formed over the entirety of the surface of the substrate. At this time, the recessed portions 219 are filled with the conductor material 218. The material of the conductor material 218 can be copper.

Figure 6D:
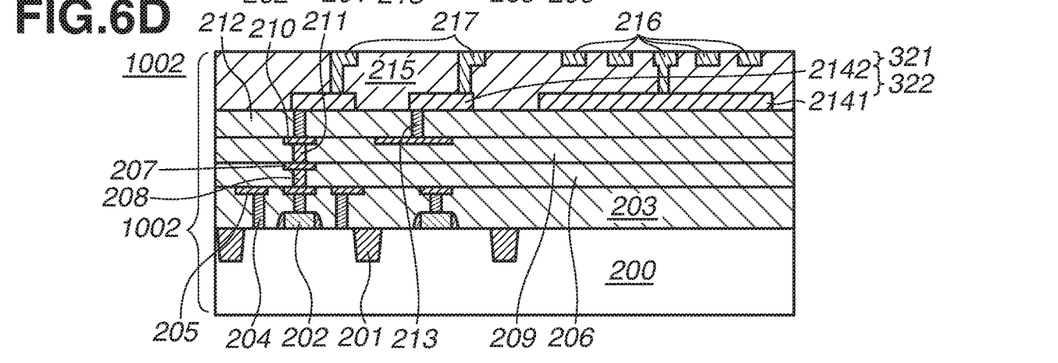

Next, as illustrated in FIG. 6D, an extra portion of the conductor material 218 is removed by CMP, thereby forming conductor portions 216 connected to the electrode 2141 and forming conductor portions 217 connected to the electrode 2142. By the above processes, the second part 1002 before being bonded is completed. When this CMP is performed, a plurality of conductor portions 216 and 217 are formed at appropriate densities in the particular portion 304 and the region other than the particular portion 304. Thus, dishing and erosion by the CMP are suppressed. This improves the flatness of the surface of the substrate of the second part 1002 before being bonded.

Figure 7A:
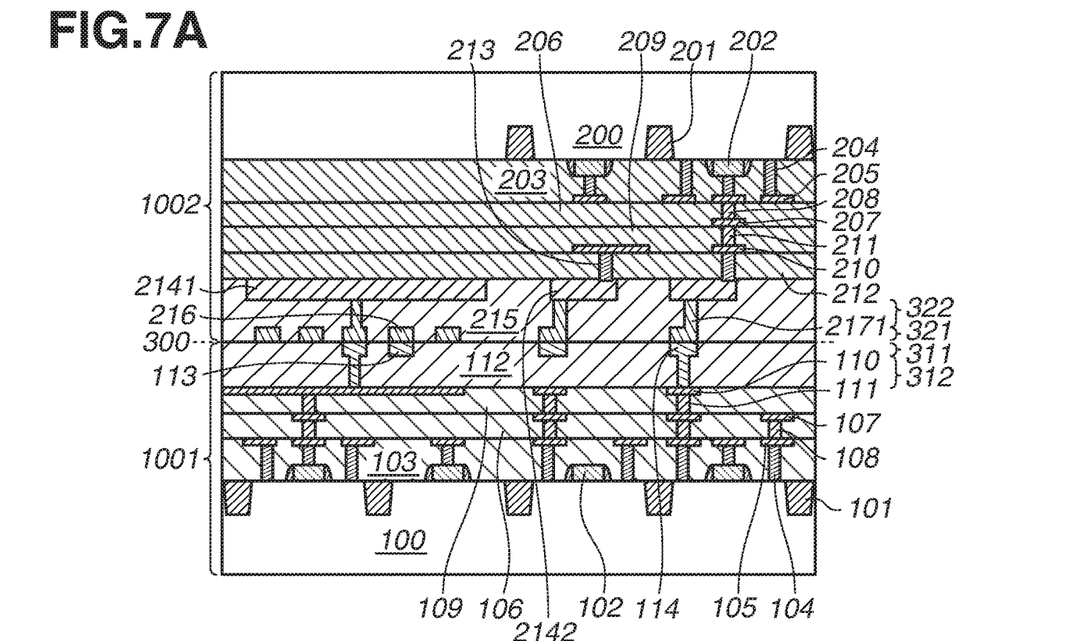
FIGS. 7A and 7B are diagrams illustrating the method for manufacturing the semiconductor apparatus.

Next, as illustrated in FIG. 7A, the second part 1002 is reversed, and the first part 1001 and the second part 1002 are bonded together on a joint surface 300. After the first part 1001 and the second part 1002 are bonded together, the first part 1001 and the second part 1002 have a structure where the second part 1002 is stacked on the first part 1001. At this time, since the surfaces of the first part 1001 and the second part 1002 are flat, it is possible to reduce poor bonding.

Figure 7B:
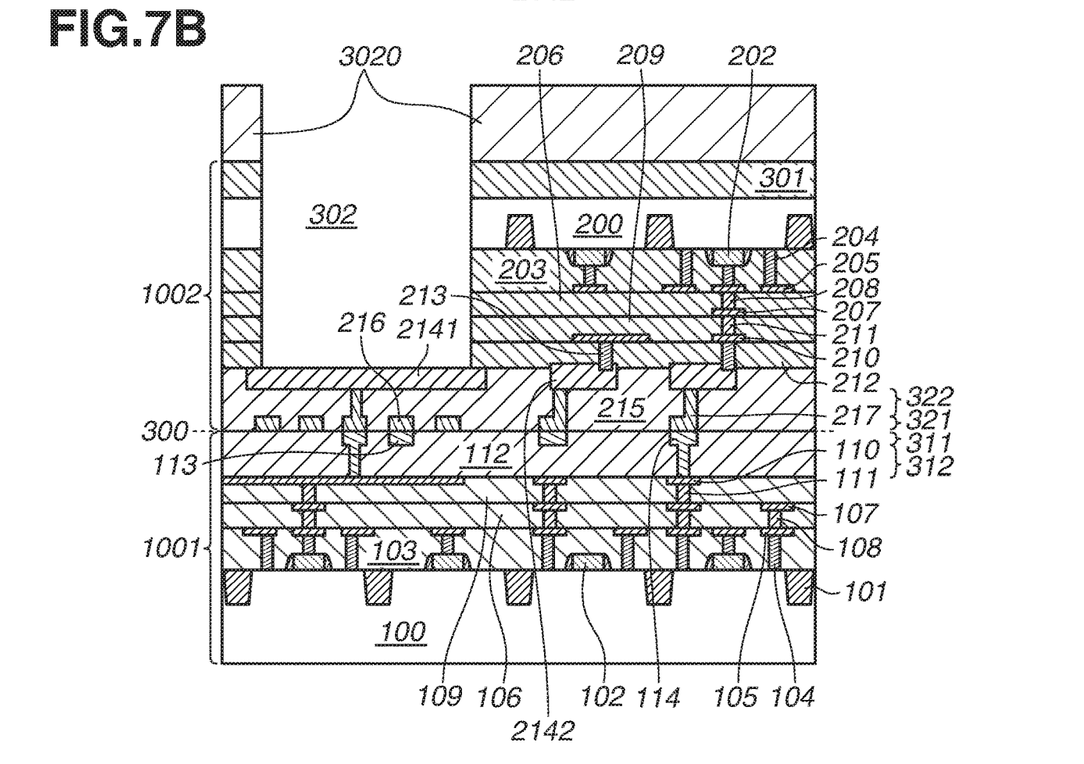

Next, as illustrated in FIG. 7B, the semiconductor layer 200 of the second part 1002 is thinned to a thickness of approximately several to several tens of micrometers. Examples of the thinning method include backgrinding, CMP, and etching.

Next, as illustrated in FIG. 7B, an insulating film 301 is formed on the surface of the second part 1002. The insulating film 301 can be optionally selected. For example, the insulating film 301 is a silicon dioxide film, a silicon nitride film, a silicon oxynitride film, a carbon-containing silicon dioxide film, or a fluorine-containing silicon dioxide film. Further, the layer structure of the film may be a monolayer structure including a single type of material, or may be a multilayer structure including a plurality of materials.

Next, as illustrated in FIG. 7B, an opening 302 for exposing a part of the electrode 2141 from the surface of the top layer of the stacked substrates is formed by etching. A photoresist 3020 is used for etching to form the opening 302.

At an appropriate timing after the semiconductor layer 200 is thinned, a color filter and a macro lens can be formed on the semiconductor layer 200.

Then, a conductive member 303 connected to the electrode 2141 is formed in the opening 302 by wire bonding. At this time, a mechanical stress is applied to the joint surface 300. The particular portion 304, however, includes insulator portions sandwiched between conductor portions in directions (the orthogonal directions X and Y) parallel to the joint surface 300. This efficiently relieves the stress. Thus, it is possible to reduce poor bonding due to the stress.

In the present exemplary embodiment, the first part 1001 is electrically connected to the electrode 2141 via the third wiring layer 110, vias 1130, and conductor portions 1131 of the first part 1001 and conductor portions 2161 and vias 2160 of the second part 1002. The present exemplary embodiment, however, is not limited to this.

The trench 801 illustrated in FIGS. 4A and 4B is formed in a self-aligned manner by forming the photoresist 3020 with a larger width than that of the electrode 2141 and etching the insulator member 215 using the electrode 2141 as a mask. In this case, side walls including a part of the insulator member 215 may also be formed on the side surfaces of the electrode 2141. In this case, the trench 801 is located between the side walls and the insulator member 215.

Further, from a viewpoint of the manufacturing method, the surface of each part forming the joint surface 300 should be as flat as possible before the parts are bonded together. If the flatness of the surface of each part is low, the parts are not sufficiently bonded together. This can cause a failure in the semiconductor apparatus. The electrode 2141 has a size of approximately 50 to 500 μm square and therefore has a large surface area. Thus, the flatness of the surface of each part depends on the arrangement patterns of conductor portions in the particular portion 304.

As an example, a case will be described where only a single conductor portion having the same shape and the same surface area as those of an electrode is placed in the particular portion 304. In this case, a mechanical stress generated when wire bonding is performed is not sufficiently relieved when being transmitted from the electrode to a joint surface via the conductor portion. Thus, a large stress can be applied to the joint surface. This can cause a failure in the semiconductor apparatus.

Further, a conductor portion having a large surface area is likely to be influenced by dishing by CMP. Thus, large depressions and protrusions can be formed on a substrate before being bonded. Thus, substrates are not sufficiently bonded together, which can lead to a manufacturing failure.

In the present exemplary embodiment, the particular portion 304 includes the insulator portions sandwiched between the conductor portions 113 and 216. These insulator portions disperse a mechanical stress generated on the joint surface 300 in the particular portion 304, thereby relieving stress applied to the joint surface 300. This can reduce poor bonding due to the stress. Further, in addition to this, a trench is provided in contact with an electrode in the outer periphery of an electrode, whereby it is possible to further relieve a mechanical stress when wire bonding is performed.

Further, based on the method for manufacturing the semiconductor apparatus according to the present exemplary embodiment, dishing and erosion are suppressed when conductor portions are formed by a CMP method. This improves the flatness of the surface of a substrate before being bonded and therefore can reduce a manufacturing failure due to poor bonding of substrates.

The equipment EQP illustrated in FIG. 1B will be described in detail. The semiconductor apparatus APR can include a semiconductor device IC including the semiconductor layer 100, and a package PKG for accommodating the semiconductor device IC. The package PKG can include a base to which the semiconductor device IC is fixed, a cover body, such as glass, opposed to the semiconductor device IC, and a connection member, such as a bonding wire or a bump, connecting a terminal provided in the base and a terminal provided in the semiconductor device IC.

The equipment EQP can further include at least any of an optical system OPT, a control apparatus CTRL, a processing apparatus PRCS, a display apparatus DSPL, a storage apparatus MMRY, and a machine apparatus MCHN. The optical system OPT forms an image on the semiconductor apparatus APR and is, for example, a lens, a shutter, and a mirror. The control apparatus CTRL controls the semiconductor apparatus APR and is, for example, a photoelectric conversion apparatus such as an application-specific integrated circuit (ASIC). The processing apparatus PRCS processes a signal output from the semiconductor apparatus APR and is a photoelectric conversion apparatus such as a central processing unit (CPU) or an ASIC for configuring an analog front end (AFE) or a digital front end (DFE). The display apparatus DSPL is an electroluminescent (EL) display apparatus or a liquid crystal display apparatus for displaying information (an image) obtained by the semiconductor apparatus APR. The storage apparatus MMRY is a magnetic device or a semiconductor device for storing information (an image) obtained by the semiconductor apparatus APR. The storage apparatus MMRY is a volatile memory such as a static random-access memory (SRAM) or a dynamic random-access memory (DRAM), or a non-volatile memory such as a flash memory or a hard disk drive. The machine apparatus MCHN includes a movable portion or a propulsive portion such as a motor or an engine. The equipment EQP displays a signal output from the semiconductor apparatus APR on the display apparatus DSPL, or transmits a signal output from the semiconductor apparatus APR to outside, using a communication apparatus (not illustrated) included in the equipment EQP. To this end, the equipment EQP should further include the storage apparatus MMRY and the processing apparatus PRCS separately from a storage circuit and an arithmetic circuit included in the semiconductor apparatus APR. The machine apparatus MCHN can be controlled based on a signal output from the semiconductor apparatus APR.

The equipment EQP illustrated in FIG. 1B can be an electronic equipment such as an information terminal (e.g., a smartphone or a wearable terminal) or a camera (e.g., an interchangeable lens camera, a compact camera, a video camera, or a monitoring camera) having an image capturing function. The machine apparatus MCHN in the camera can drive the components of the optical system OPT for a zooming operation, a focusing operation, and a shutter operation. Further, the equipment EQP can be a transportation equipment such as a vehicle, a vessel, or a flying object. The machine apparatus MCHN in the transportation equipment can be used as a moving device. The equipment EQP as the transportation equipment is suitable for a transportation equipment that transports the semiconductor apparatus APR, or a transportation equipment that assists and/or automates driving (maneuvering) by an image capturing function. The processing apparatus PRCS for assisting and/or automating driving (maneuvering) can perform processing for operating the machine apparatus MCHN as the moving device based on information obtained by the semiconductor apparatus APR. Alternatively, the equipment EQP may be a medical equipment such as an endoscope, a measurement equipment such as a distance measurement sensor, or an analysis equipment such as an electron microscope.

Using the semiconductor apparatus APR according to the present exemplary embodiment, it is possible to obtain high performance of a semiconductor apparatus. Thus, when the semiconductor apparatus APR is mounted on a transportation equipment, and an image outside the transportation equipment is captured, or the external environment is measured, it is possible to obtain excellent image quality and measurement accuracy. Further, it is possible to enhance the reliability of the semiconductor apparatus so that the semiconductor apparatus can be mounted on a transportation equipment. Thus, in a case where a transportation equipment is manufactured and sold, the determination of the mounting of the semiconductor apparatus APR according to the present exemplary embodiment on the transportation equipment is beneficial in enhancing the performance of the transportation equipment.

The above exemplary embodiment can be appropriately changed without departing from its technical idea. The disclosed content of the exemplary embodiment includes not only that clearly specified in the specification but also all matters that can be understood from the specification and the drawings attached to the specification.

While the disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-230988, filed Nov. 30, 2017, which is hereby incorporated by reference herein in its entirety.

What is claimed is:
1. A semiconductor apparatus comprising:
first and second semiconductor layers stacked to each other;
a first structure disposed between the first and second semiconductor layers; and
a second structure disposed between the first structure and the second semiconductor layer, the first and second structures being bonded to each other,
wherein the second semiconductor layer includes an opening, and
wherein in a joint surface between the first and second structures, a portion between the first semiconductor layer and the opening in a first direction in which the first and second semiconductor layers are stacked together includes first and second conductor portions lined up in a second direction orthogonal to the first direction, and an insulator portion surrounding each of the first and second conductor portions to include a portion located between the first and second conductor portions.

2. A semiconductor apparatus comprising:
first and second semiconductor layers stacked to each other;
a first structure disposed between the first and second semiconductor layers; and
a second structure disposed between the first structure and the second semiconductor layer, the first and second structures being bonded to each other,
wherein the second semiconductor layer includes an opening, and
wherein in one of the first and second structures, a portion between the first semiconductor layer and a first portion in a first direction in which the first and second semiconductor layers are stacked together includes first and second conductor portions lined up in a second direction orthogonal to the first direction, and an insulator portion surrounding each of the first and second conductor portions to include a portion located between the first and second conductor portions, and the insulator portion is in contact with an insulator member included in the other of the first and second structures.

3. The semiconductor apparatus according to claim 1, wherein the first and second conductor portions are included in the second structure.

4. The semiconductor apparatus according to claim 3, wherein the second conductor portion is in contact with an insulator member included in the first structure.

5. The semiconductor apparatus according to claim 4, wherein between the first semiconductor layer and the second structure in the first direction, the portion includes a third conductor portion, a fourth conductor portion, and an insulator portion located between the third and fourth conductor portions in the second direction orthogonal to the first direction, and the first conductor portion is bonded to the third conductor portion.

6. The semiconductor apparatus according to claim 5, wherein the second conductor portion is bonded to the fourth conductor portion, and the insulator portion located between the first and second conductor portions is in contact with the insulator portion located between the third and fourth conductor portions.

7. The semiconductor apparatus according to claim 3, wherein, in the first structure, wiring is provided between the first semiconductor layer and the opening in the first direction.

8. The semiconductor apparatus according to claim 1,
wherein between the first semiconductor layer and the second structure in the first direction, the portion includes a third conductor portion, a fourth conductor portion, and an insulator portion located between the third and fourth conductor portions in the second direction orthogonal to the first direction, and the first conductor portion is bonded to the third conductor portion,
wherein, in the first structure, wiring is provided between the first semiconductor layer and the opening in the first direction, and
wherein the wiring is connected to one of third and fourth conductor portions and is not connected to the other of the third and fourth conductor portions.

9. The semiconductor apparatus according to claim 5, wherein one of the third and fourth conductor portions is in contact with an insulator member included in the second structure.

10. The semiconductor apparatus according to claim 1, wherein in the second structure, an electrode is provided between the insulator portion and the opening in the first direction.

11. The semiconductor apparatus according to claim 10, wherein the electrode is connected to one of the first and second conductor portions and is not connected to the other of the first and second conductor portions.

12. The semiconductor apparatus according to claim 10, wherein the electrode includes a portion located between the second and first semiconductor layers in the first direction.

13. The semiconductor apparatus according to claim 10, wherein a width of the electrode in the second direction is smaller than a width of the opening in the second direction.

14. A semiconductor apparatus comprising:
first and second semiconductor layers stacked to each other;
a first structure disposed between the first and second semiconductor layers; and
a second structure disposed between the first structure and the second semiconductor layer, the first and second structures being bonded to each other,
wherein the second semiconductor layer includes an opening,
wherein in a joint surface between the first and second structures, a portion between the first semiconductor layer and the opening in a first direction in which the first and second semiconductor layers are stacked together includes first and second conductor portions lined up in a second direction orthogonal to the first direction, and an insulator portion located between the first and second conductor portions,
wherein the semiconductor apparatus further comprises an electrode provided between the insulator portion and the opening in the first direction,
wherein the second structure includes an insulator member disposed side by side with the electrode in the second direction, and a trench is provided between the electrode and the insulator member, and
wherein a distance between the trench and the first semiconductor layer is smaller than a distance between the electrode and the first semiconductor layer.

15. The semiconductor apparatus according to claim 14, wherein the trench reaches the first structure.

16. The semiconductor apparatus according to claim 11, wherein a main component of the electrode is aluminum, and main components of the first and second conductor portions are copper.

17. The semiconductor apparatus according to claim 14, wherein a conductive member is placed in the opening.

18. The semiconductor apparatus according to claim 1, wherein the first semiconductor layer is thicker than the second semiconductor layer.

19. The semiconductor apparatus according to claim 1,
wherein a photodiode is provided in the second semiconductor layer, and
wherein a transistor is provided in the first semiconductor layer.

20. An equipment comprising:
the semiconductor apparatus according to claim 1; and
at least any of an optical system configured to form an image on the semiconductor apparatus, a control apparatus configured to control the semiconductor apparatus, a processing apparatus configured to process a signal output from the semiconductor apparatus, a display apparatus configured to display information obtained by the semiconductor apparatus, a storage apparatus configured to store information obtained by the semiconductor apparatus, and a machine apparatus controlled based on a signal output from the semiconductor apparatus.

\* \* \* \* \*